US005903176A

United States Patent [19]

Westgate

[11] Patent Number: 5,903,176

[45] Date of Patent: May 11, 1999

[54] CLOCK CIRCUIT FOR GENERATING A HIGH RESOLUTION OUTPUT FROM A LOW RESOLUTION CLOCK

[75] Inventor: Wayne F. Westgate, Sunnyvale, Calif.

[73] Assignee: Litton Systems, Inc., Woodland Hills, Calif.

[21] Appl. No.: 08/707,435

[22] Filed: Sep. 4, 1996

[51] Int. Cl.[6] .......... H03K 3/00

[52] U.S. Cl. .......... 327/295; 327/258; 327/293

[58] Field of Search .......... 327/291–295, 327/256–258; 331/1 A, 57

[56] References Cited

U.S. PATENT DOCUMENTS

| | | | |
|---|---|---|---|
| 4,847,870 | 7/1989 | Butcher | 375/87 |
| 4,989,175 | 1/1991 | Boris et al. | 364/900 |
| 5,235,699 | 8/1993 | Shaffer et al. | 395/550 |
| 5,247,656 | 9/1993 | Kabuo et al. | 395/550 |
| 5,544,342 | 8/1996 | Dean | 395/446 |

*Primary Examiner*—Kenneth B. Wells
*Attorney, Agent, or Firm*—William M. Hobby, III

[57] ABSTRACT

A high resolution clock circuit apparatus and a method of generating a high resolution clock output from a lower resolution clock input utilizes conventional technology. A standard clock generates a clock frequency which is divided by a flip-flop circuit and is applied to a low skew differential clock driver which distributes the clock into a plurality of separate outputs, each output is applied to a different length delay line. The output of each delay line is applied to a latching circuit, such as a low power octal ECL/TTL bidirectional translator. Each of the plurality of delay lines is sampled and a time word is latched when a time measurement is to be made. In this event, a control signal toggles from low to high which latches a digital word representing that subnanosecond interval of time. A shift register also receives the input clock frequency and includes a feedback loop and is applied to the latch circuit. The output of the two latches are input into a PROM used to convert the input code into a binary coded decimal.

9 Claims, 5 Drawing Sheets

DELAY LINE COUNT SEQUENCE

| TIME SEGMENT | DELAY LINE OUTPUTS BINARY GRAY CODE | | | | | | | | PROM INPUT HEXADECIMAL CODE |
|---|---|---|---|---|---|---|---|---|---|
| nSEC | B7 | B6 | B5 | B4 | B3 | B2 | B1 | B0 | A7–A0 |
| 0 | 0 | 0 | 0 | 0 | 0 | 0 | 0 | 0 | 00H |
| 0.625 | 0 | 0 | 0 | 0 | 0 | 0 | 0 | 1 | 01H |
| 1.25 | 0 | 0 | 0 | 0 | 0 | 0 | 1 | 1 | 03H |
| 1.875 | 0 | 0 | 0 | 0 | 0 | 1 | 1 | 1 | 07H |
| 2.5 | 0 | 0 | 0 | 0 | 1 | 1 | 1 | 1 | 0FH |
| 3.125 | 0 | 0 | 0 | 1 | 1 | 1 | 1 | 1 | 1FH |
| 3.75 | 0 | 0 | 1 | 1 | 1 | 1 | 1 | 1 | 3FH |
| 4.375 | 0 | 1 | 1 | 1 | 1 | 1 | 1 | 1 | 7FH |
| 5 | 1 | 1 | 1 | 1 | 1 | 1 | 1 | 1 | FFH |
| 5.625 | 1 | 1 | 1 | 1 | 1 | 1 | 1 | 0 | FEH |
| 6.25 | 1 | 1 | 1 | 1 | 1 | 1 | 0 | 0 | FCH |
| 6.875 | 1 | 1 | 1 | 1 | 1 | 0 | 0 | 0 | F8H |
| 7.5 | 1 | 1 | 1 | 1 | 0 | 0 | 0 | 0 | F0H |
| 8.125 | 1 | 1 | 1 | 0 | 0 | 0 | 0 | 0 | E0H |
| 8.75 | 1 | 1 | 0 | 0 | 0 | 0 | 0 | 0 | C0H |
| 9.375 | 1 | 0 | 0 | 0 | 0 | 0 | 0 | 0 | 80H |

FIG. 3

SHIFT REGISTER COUNT SEQUENCE

| TIME SEGMENT | SHIFT REGISTER OUTPUTS BINARY GRAY CODE | | | | | | | | PROM INPUT HEXADECIMAL CODE |
|---|---|---|---|---|---|---|---|---|---|
| nSEC | Q7 | Q6 | Q5 | Q4 | Q3 | Q2 | Q1 | Q0 | A15–A8 |
| 0 | 0 | 0 | 0 | 0 | 0 | 0 | 0 | 0 | 00H |
| 5 | 0 | 0 | 0 | 0 | 0 | 0 | 0 | 1 | 01H |
| 10 | 0 | 0 | 0 | 0 | 0 | 0 | 1 | 1 | 03H |
| 15 | 0 | 0 | 0 | 0 | 0 | 1 | 1 | 1 | 07H |
| 20 | 0 | 0 | 0 | 0 | 1 | 1 | 1 | 1 | 0FH |
| 25 | 0 | 0 | 0 | 1 | 1 | 1 | 1 | 1 | 1FH |
| 30 | 0 | 0 | 1 | 1 | 1 | 1 | 1 | 1 | 3FH |
| 35 | 0 | 1 | 1 | 1 | 1 | 1 | 1 | 1 | 7FH |
| 40 | 1 | 1 | 1 | 1 | 1 | 1 | 1 | 1 | FFH |
| 45 | 1 | 1 | 1 | 1 | 1 | 1 | 1 | 0 | FEH |
| 50 | 1 | 1 | 1 | 1 | 1 | 1 | 0 | 0 | FCH |
| 55 | 1 | 1 | 1 | 1 | 1 | 0 | 0 | 0 | F8H |
| 60 | 1 | 1 | 1 | 1 | 0 | 0 | 0 | 0 | F0H |
| 65 | 1 | 1 | 1 | 0 | 0 | 0 | 0 | 0 | E0H |
| 70 | 1 | 1 | 0 | 0 | 0 | 0 | 0 | 0 | C0H |
| 75 | 1 | 0 | 0 | 0 | 0 | 0 | 0 | 0 | 80H |

FIG. 4

FIG. 5

| FIG. 5A |
|---|
| FIG. 5B |

PROGRAMMABLE READ ONLY MEMORY DATA CONTENTS

| PROM ADDRESS 1 | PROM ADDRESS 2 | PROM OUTPUT | PROM ADDRESS 1 | PROM ADDRESS 2 | PROM OUTPUT |
|---|---|---|---|---|---|
| 80F0H | 00F0H | 7CH | 07F0H | 0FF0H | 1CH |
| 80E0H | 00E0H | 7DH | 07E0H | 0FE0H | 1DH |
| 80C0H | 00C0H | 7EH | 07C0H | 0FC0H | 1EH |
| 8080H | 0080H | 7FH | 0780H | 0F80H | 1FH |
| 8000H | 0000H | 00H | 0700H | 0F00H | 20H |
| 8001H | 0001H | 01H | 0701H | 0F01H | 21H |
| 8003H | 0003H | 02H | 0703H | 0F03H | 22H |
| 8007H | 0007H | 03H | 0707H | 0F07H | 23H |
| 000FH | 010FH | 04H | 0F0FH | 1F0FH | 24H |
| 001FH | 011FH | 05H | 0F1FH | 1F1FH | 25H |
| 003FH | 013FH | 06H | 0F3FH | 1F3FH | 26H |
| 007FH | 017FH | 07H | 0F7FH | 1F7FH | 27H |
| 00FFH | 01FFH | 08H | 0FFFH | 1FFFH | 28H |
| 00FEH | 01FEH | 09H | 0FFEH | 1FFEH | 29H |
| 00FCH | 01FCH | 0AH | 0FFCH | 1FFCH | 2AH |
| 00F8H | 01F8H | 0BH | 0FF8H | 1FF8H | 2BH |
| 01F0H | 03F0H | 0CH | 1FF0H | 3FF0H | 2CH |
| 01E0H | 03E0H | 0DH | 1FE0H | 3FE0H | 2DH |
| 01C0H | 03C0H | 0EH | 1FC0H | 3FC0H | 2EH |
| 0180H | 0380H | 0FH | 1F80H | 3F80H | 2FH |
| 0100H | 0300H | 10H | 1F00H | 3F00H | 30H |
| 0101H | 0301H | 11H | 1F01H | 3F01H | 31H |
| 0103H | 0303H | 12H | 1F03H | 3F03H | 32H |
| 0107H | 0307H | 13H | 1F07H | 3F07H | 33H |
| 030FH | 070FH | 14H | 3F0FH | 7F0FH | 34H |
| 031FH | 071FH | 15H | 3F1FH | 7F1FH | 35H |
| 033FH | 073FH | 16H | 3F3FH | 7F3FH | 36H |
| 037FH | 077FH | 17H | 3F7FH | 7F7FH | 37H |
| 03FFH | 07FFH | 18H | 3FFFH | 7FFFH | 38H |
| 03FEH | 07FEH | 19H | 3FFEH | 7FFEH | 39H |
| 03FCH | 07FCH | 1AH | 3FFCH | 7FFCH | 3AH |
| 03F8H | 07F8H | 1BH | 3FF8H | 7FF8H | 3BH |

FIG. 5A

| | | | | | |
|---|---|---|---|---|---|
| 7FF0H | FFF0H | 3CH | F8F0H | F0F0H | 5CH |
| 7FE0H | FFE0H | 3DH | F8E0H | F0E0H | 5DH |
| 7FC0H | FFC0H | 3EH | F8C0H | F0C0H | 5EH |
| 7F80H | FF80H | 3FH | F880H | F080H | 5FH |
| 7F00H | FF00H | 40H | F800H | F000H | 60H |
| 7F01H | FF01H | 41H | F801H | F001H | 61H |
| 7F03H | FF03H | 42H | F803H | F003H | 62H |
| 7F07H | FF07H | 43H | F807H | F007H | 63H |
| FF0FH | FE0FH | 44H | F00FH | E00FH | 64H |
| FF1FH | FE1FH | 45H | F01FH | E01FH | 65H |
| FF3FH | FE3FH | 46H | F03FH | E03FH | 66H |
| FF7FH | FE7FH | 47H | F07FH | E07FH | 67H |
| FFFFH | FEFFH | 48H | F0FFH | E0FFH | 68H |
| FFFEH | FEFEH | 49H | F0FEH | E0FEH | 69H |
| FFFCH | FEFCH | 4AH | F0FCH | E0FCH | 6AH |
| FFF8H | FEF8H | 4BH | F0F8H | E0F8H | 6BH |
| FEF0H | FCF0H | 4CH | E0F0H | C0F0H | 6CH |
| FEE0H | FCE0H | 4DH | E0E0H | C0E0H | 6DH |
| FEC0H | FCC0H | 4EH | E0C0H | C0C0H | 6EH |
| FE80H | FC80H | 4FH | E080H | C080H | 6FH |
| FE00H | FC00H | 50H | E000H | C000H | 70H |
| FE01H | FC01H | 51H | E001H | C001H | 71H |
| FE03H | FC03H | 52H | E003H | C003H | 72H |
| FE07H | FC07H | 53H | E007H | C007H | 73H |
| FC0FH | F80FH | 54H | C00FH | 800FH | 74H |
| FC1FH | F81FH | 55H | C01FH | 801FH | 75H |
| FC3FH | F83FH | 56H | C03FH | 803FH | 76H |
| FC7FH | F87FH | 57H | C07FH | 807FH | 77H |
| FCFFH | F8FFH | 58H | C0FFH | 80FFH | 78H |
| FCFEH | F8FEH | 59H | C0FEH | 80FEH | 79H |
| FCFCH | F8FCH | 5AH | C0FCH | 80FCH | 7AH |
| FCF8H | F8F8H | 5BH | C0F8H | 80F8H | 7BH |

FIG. 5B

CLOCK CIRCUIT FOR GENERATING A HIGH RESOLUTION OUTPUT FROM A LOW RESOLUTION CLOCK

BACKGROUND OF THE INVENTION

The present invention relates to a high resolution clock circuit and to a method of generating a high resolution clock output from a lower resolution clock input and especially to a clock circuit using conventional technology and a plurality of delay lines. Many conventional clock circuits are based on the frequency of an accurate crystal oscillator. When using conventional digital circuits with a crystal oscillator to measure time, the shortest length of time that can be resolved is the period of the clock. Some military applications require high resolution to within 0.5 nanoseconds (nsec.). If conventional circuits, such as counters or shift registers are used to generate the time codes, then the clock frequency should be 2 GHz. Crystal controlled, 2 GHz frequency sources are readily available. The only kind of logic circuits that can operate at 2 GHz are those using the gallium arsenide (GaAS) process. GaAs technology is expensive because a custom circuit must be designed and fabricated on a single chip. This requires a large investment of money and time. The fastest conventional logic family is the F100K emitter coupled logic (ECL) and can operate at speeds of 0.2 GHz over the military temperature range. This is a factor of ten too slow to construct a conventional clock with a 0.5 nsec. resolution.

Prior U.S. patents of interest include the Butcher U.S. Pat. No. 4,847,870, for a high resolution digital phase-lock loop circuit which is implemented with an input clock reference frequency which is approximately the same as the output frequency of the phase-lock loop. The output is derived from delaying the input clock a variable number of gate delays ranging from no delay to one period of the input clock. A shift register controls the number of gate delays. The Shaffer et al. U.S. Pat. No. 5,235,699, is a circuit that controls, calibrates, and monitors critical timing parameters in a computer system or a network to prevent loss of or inaccurate data when transferring the data. The Kabuo et al. U.S. Pat. No. 5,247,656, is a method and apparatus for controlling a clock signal for data processing devices and includes first and second blocks which have different processing times and which operate in synchronism with a clock signal. A period of the clock signal is changed in accordance with the clock change signal. The Boris et al. U.S. Pat. No. 4,989,175, is a high speed on-chip clock phase generating system for mainframe computers and is incorporated into very large scale integrated logic chips. Each logic chip is controlled by off-chip control signals. The off-chip phase generator includes a start shift register, a stop shift register, clock shift registers to provide the phase of the clock, and start/stop run controls, all of which are coupled to off-chip control signals and synchronized to eliminate distortion and skew between phase generators on different logic chips.

The present invention is for a delay line clock with sub-nanosecond resolution from a low resolution clock frequency using a set of different length delay lines to subdivide the low resolution clock period. The different length delay lines and ECL circuit can generate a sub-nanosecond resolution from a 100 MHz. clock input using conventional technology.

SUMMARY OF THE INVENTION

A sub-nanosecond resolution clock circuit apparatus and a method of generating a sub-nanosecond resolution clock output from a lower resolution clock input utilizes conventional technology. A standard clock generates a clock frequency which is divided by a flip-flop circuit and is applied to a low skew differential clock driver which distributes the divided clock into a plurality of separate outputs, each output is applied to a different length delay line. The output of each delay line is applied to a latching circuit, such as a low power octal ECL/TTL bidirectional translator. Each of the plurality of delay lines is sampled and a time word is latched when the event to be timed generates a pulse that goes from low to high. A shift register also receives the input standard clock frequency and includes a feedback loop and the outputs of which are applied to the latch circuit. The output of the two sets of latches are input into a programmable read only memory (PROM) used to convert the input gray code into a binary coded decimal output. The PROM contents are found in FIG. 5. The circuit can generate a 0.625 nanosecond resolution from a 100 MHz clock. A method of generating a high resolution clock output from a lower resolution clock input includes the steps of generating a predetermined clock output, distributing the generated clock output into a plurality of outputs and applying each clock output onto a different length delay line to delay or phase shift each input clock pulse by a predetermined time. The delay lines are sampled with a latching circuit whenever a time measurement is to be made. The leading edge of pulse (LEP) signal (shown in FIG. 1) goes from low to high capturing the clock state at that instant. In this case, the shortest delay line is 0.625 nsec long. Each successive line is an additional 0.625 nsec and the longest delay line is 5.00 nsec. In this way, the low resolution clock period (10 nsec) is subdivided into sixteen 0.625 nsec segments.

BRIEF DESCRIPTION OF THE DRAWINGS

Other objects, features, and advantages of the present invention will be apparent from the written description and the drawings in which:

FIG. 3 is a table showing the binary gray code of the delay line outputs and equivalent hexadecimal code representation;

FIG. 4 is a table of the count sequence of the shift register; and

FIGS. 5A and 5B are tables of PROM contents.

DESCRIPTION OF THE PREFERRED EMBODIMENTS

Figure 1:
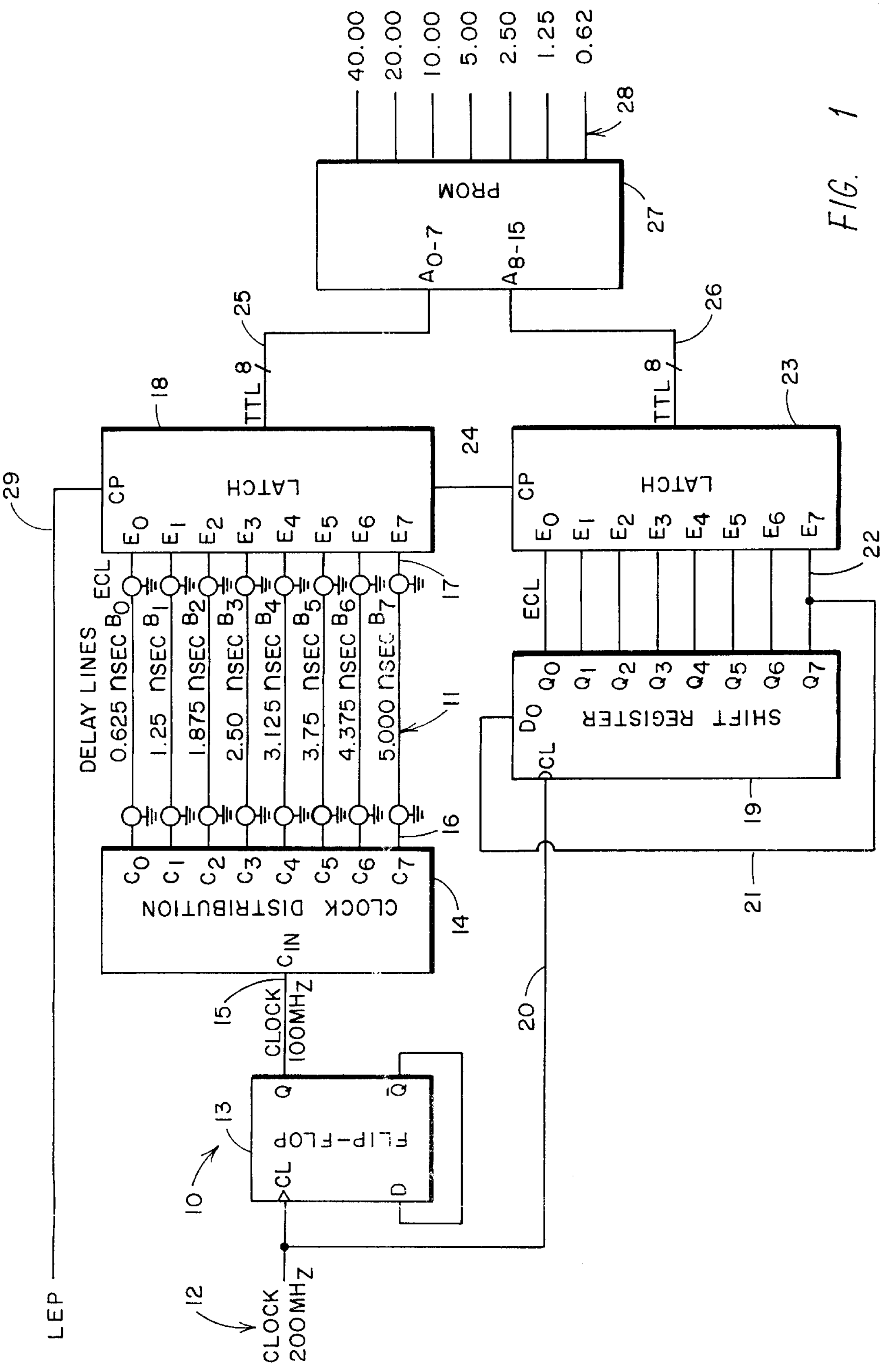
FIG. 1 is a clock circuit in accordance with the present invention.

Referring to the drawings and especially to FIG. 1, a subnanosecond (such as 0.625 nsec.) resolution clock circuit 10, uses analog delay lines 11 and an emitter couple logic (ECL). Block diagram 10 of the circuit can generate a 0.625 nsec. resolution from 100 nsec. clock input and uses conventional technology. A 200 MHz clock 12 is input into a 100351 flip-flop circuit 13 that divides the frequency by two and outputs a symmetric 100 MHz clock. A clock distribution circuit, such as a 100311 low skew 1 to 9 differential clock driver 14 takes 100 MHz signal from the line 15 and fans out the clock into nine separate outputs 16. The skew between the outputs is less than 30 picoseconds. Only eight outputs are needed in the present circuit. Each of the eight outputs 16 drives a different length delay line 11, as shown in FIG. 1. Each delay line 11 is terminated in 50 ohms and is designed such that the trace lengths connecting the differential clock driver 14 to the delay lines are all equal. The 50 ohm terminations 17 are connected to the inputs of a 100329 low power octal emitter couple logic/transistor transistor logic (ECL/TTL) bidirectional translator 18 which includes registers.

The circuit 18 samples the eight delay lines 11 and latches a time word when the LEP signal on line 29 goes from low to high. The trace lengths from the delay lines to the 100329 latch circuit are made equal. The delay lines 11 may be constructed from standard 0.047 diameter 50 ohm TEFLON semi-rigid coax. The dielectric constant of the TEFLON is 2.09 which means, given a delay, the length of the cable can be calculated and cut to within six psec.'s. The difference in delay between two adjacent lines including driver amp skew is within 0.625+/−0.036 nsec. The 200 MHz clock 12 is also applied through the line 20 to a 100341 shift register which includes a feedback loop 21 and which is thus clocked at 200 MHz and produces a series of eight outputs 22 into a 100329 latching circuit 23 connected to the latch 18 through the line 24. The output of the latches 18 and 23 on lines 25 and 26 are TTL and are applied to a CY7C 286 PROM 27. Prom 27 converts the gray code into a binary coded decimal and provides an overlap code between the delay lines and the shift register and produces the circuit output 28. The PROM contents are found in FIG. 4. In operation, a 200 MHz ECL clock 12 is input to the 100331D flip-flop circuit where it is divided by two to produce an output frequency of 100 MHz on the line 15. The 100 MHz ECL signal has a symmetric duty cycle.

Figure 2:
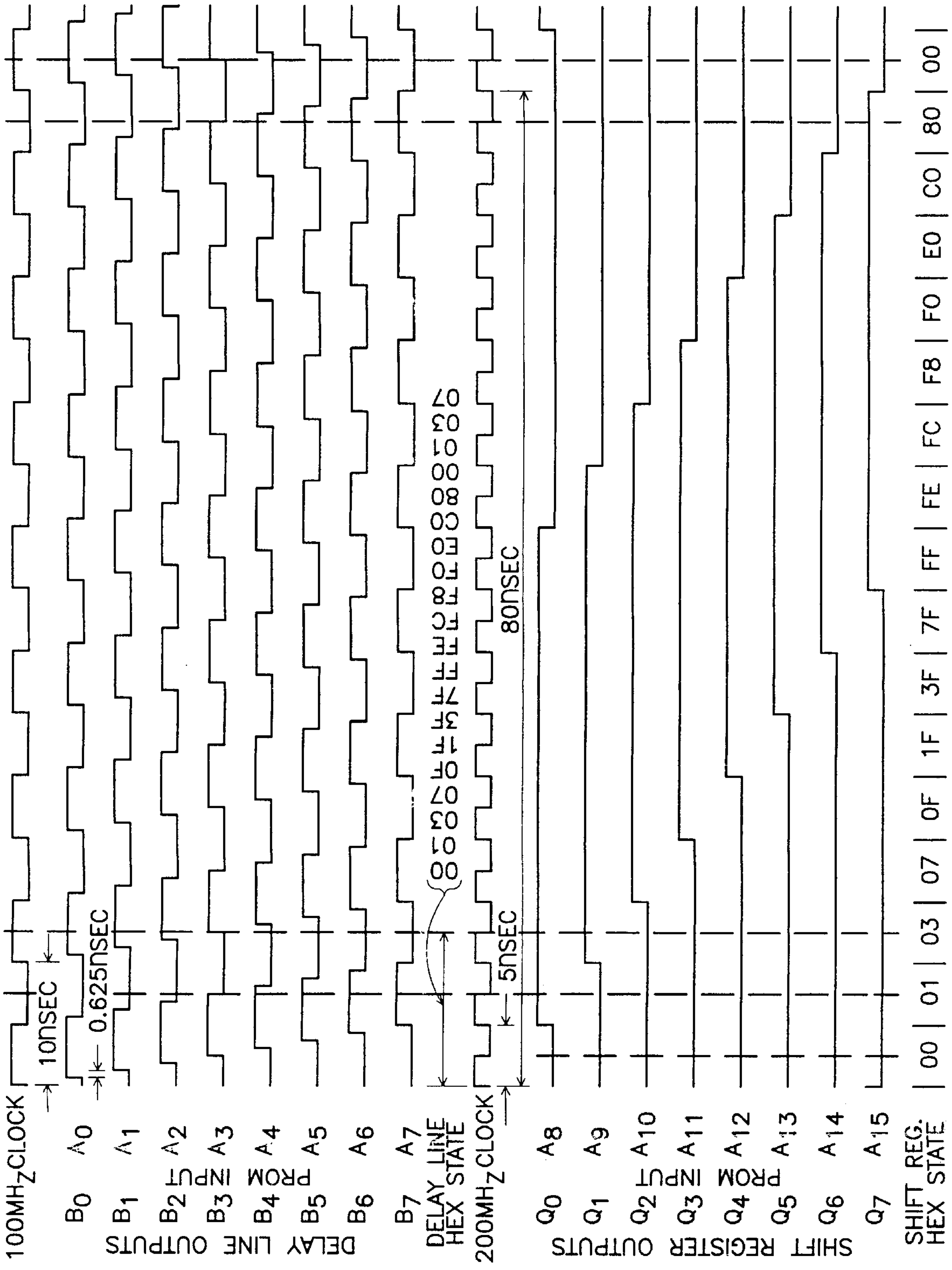
FIG. 2 is a timing diagram showing the shift register outputs.

The timing diagram of FIG. 2 shows both the 200 MHz clock and the 100 MHz clock and shows that the B0 to B7 outputs subdivide 10 nanoseconds of time into 16 parts. Each of the 16 parts has a unique digital word associated with it. The FIG. 3 table shows a binary gray code of each subdivision. The gray code has the advantage in that there is only one bit change between any adjacent state and all bits are weighed the same. The second part of the circuit of FIG. 1 has the 100241 shift register that is fed back onto itself and clocked at 200 MHz. The FIG. 2 timing diagram shows the eight shift register outputs Q0–Q7 while the table of FIG. 4 shows the count sequence of the shift register 19 and can be seen to repeat every 80 nanoseconds. The outputs of the delay lines 11 and the shift register 19 are input to the latch circuits 18 and 23. Whenever a measurement of time is to be taken, the leading edge pulse (LEP) signal transitions from low to high. That is, all 16 outputs are latched into a pair of 100329 latches 18 and 23. The 100329 latch circuits serve two functions in that they translate ECL to TTL as well as latch the input logic states. The output of the latches 18 and 23 are input into the PROM 27 which converts the gray code into the binary coded decimal and provides an overlap code between the delay lines 11 and the shift register 19. The PROM contents are found in FIG. 5. The delay lines 11 and the shift register 19 both have five nanosecond states which means that, when resolving five nanoseconds, the delay line outputs are used and the shift register outputs are corrected. The don't care states are programmed into the PROM memory 27. Thus the delay lines 11 and the shift register 19 outputs can be skewed +/−2.5 nsec. with respect to each other without an error occurring.

The method of the invention includes the generating of the high resolution clock output, such as 0.625 nanoseconds from a lower resolution clock input, such as a 200 MHz clock. The generated clock signal is applied to a flip-flop circuit which divides a 200 MHz clock into a 100 MHz which signal is then applied to a clock distribution circuit which distributes the output into a plurality of outputs. Like signals are applied onto different length delay lines to delay each clock pulse for a different time. The output of each delay line is applied to the latch circuit which latches the time word when the LEP signal goes from low to high. The counting of the output 0.625 nsec intervals is with a shift register in a predetermined sequence and the output of the delay lines which subdivide a 10 nsec period into sixteen, 0.625 nsec periods applied to the latch circuits which translate the ECL to the TTL which is applied to a PROM which converts the output to a binary coded decimal.

It should be clear at this time that a high resolution clock circuit as well as a method of generating a high resolution clock output from a low resolution clock input uses clocking pulses applied to different length delay lines for producing a subnanosecond output using conventional technology. However, the present invention is not to be construed as limited to the forms shown which are to be considered illustrative rather than restrictive.

I claim:

1. A high resolution clock circuit comprising:

a clock generating a timing frequency signal;

a clock distribution circuit connected to said clock and having a plurality of outputs for producing a plurality of output signals therefrom;

a plurality of delay lines, each said delay line being coupled to one of said plurality of outputs of said clock distribution circuit to receive one of the signals therefrom and each said delay line having a different signal delay from each of the other said delay lines, said delay lines outputting delayed versions of the received signals;

a first latching circuit having each of said plurality of delay lines coupled thereto to thereby latch the signals received from said plurality of delay lines;

a second latching circuit;

a shift register coupled to said clock for receiving said timing frequency signal, said shift register having a plurality of outputs coupled to said second latching circuit; and a conversion circuit connected to said first and second latching circuits to convert signals from said first and second latching circuits into output clock signals of a higher resolution than that of said timing frequency signal.

2. A high resolution clock circuit in accordance with claim 1 in which each delay line terminates in about 50 ohm resistance.

3. A high resolution clock circuit in accordance with claim 2 in which each delay line is an analog delay line.

4. A high resolution clock circuit in accordance with claim 1 in which said clock includes a frequency dividing circuit reducing the frequency of clock generated frequency signal.

5. A high resolution clock circuit in accordance with claim 1 in which each delay line is a coaxial cable delay line of a different length from the other delay lines.

6. A high resolution clock circuit in accordance with claim 1 in which said clock produces a 200 MHz clock input.

7. A high resolution clock circuit in accordance with claim 4 in which said frequency dividing circuit is a flip flop circuit.

8. A high resolution clock circuit in accordance with claim 1 in which said shift register has a feed back loop.

9. A high resolution clock circuit in accordance with claim 1 including a PROM coupled to the outputs from said first latching circuit to convert the signals received from said first latching circuit into binary coded decimal signals.

* * * * *